United States Patent
Watanabe et al.

(10) Patent No.: US 6,731,046 B2
(45) Date of Patent: May 4, 2004

(54) SURFACE ACOUSTIC WAVE ELEMENT AND MANUFACTURING METHOD OF THE SAME

(75) Inventors: Hiroki Watanabe, Ishikawa-ken (JP); Hideharu Ieki, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 45 days.

(21) Appl. No.: 10/189,913

(22) Filed: Jul. 5, 2002

(65) Prior Publication Data

US 2003/0025422 A1 Feb. 6, 2003

(30) Foreign Application Priority Data

Jul. 6, 2001 (JP) ........................ 2001-206587
May 27, 2002 (JP) ........................ 2002-152815

(51) Int. Cl.[7] .............................................. H03H 9/25
(52) U.S. Cl. .................... 310/313 R; 310/363; 310/364
(58) Field of Search ...................... 310/313 R, 313 B, 310/313 C, 363, 364

(56) References Cited

U.S. PATENT DOCUMENTS 5,729,186 A * 3/1998 Seki et al. ................... 333/194
6,034,578 A * 3/2000 Fujita et al. .................. 333/193
6,404,110 B1 * 6/2002 Nakashima et al. ........ 310/364
6,534,901 B1 * 3/2003 Tsuzuki et al. .............. 310/348
6,552,475 B2 * 4/2003 Hori et al. .................... 310/364
2002/0121841 A1 * 9/2002 Shimoe et al. .......... 310/313 B

FOREIGN PATENT DOCUMENTS

| JP | 4-21205 | * | 1/1992 | ............. 310/313 B |
| JP | 7-212175 | | 8/1995 | ........... H03H/9/145 |
| JP | WO99/05788 | | 2/1999 | ........... H03H/9/145 |
| JP | 2001-053577 | | 2/2001 | ............. H03H/9/25 |
| TW | 461178 | | 10/2001 | ............. H03H/9/25 |

* cited by examiner

Primary Examiner—Thomas M. Dougherty
(74) Attorney, Agent, or Firm—Keating & Bennett, LLP

(57) ABSTRACT

An inexpensive surface acoustic wave apparatus uses a flip chip bonding technique and is capable of reducing an ohmic loss by reducing an electrode electrical resistance and also operates at a high-frequency range. A surface acoustic wave apparatus has a surface acoustic wave element bonded to a package by using a bonding flip chip technique. In the surface acoustic wave element, on a piezoelectric substrate, an IDT electrode, bus bar electrodes, reflector electrodes, relay electrodes, and electrode pads are disposed. Conductive films are disposed on the electrode pads and define a first metallic film, and the conductive films are also disposed on at least any of the bus bar electrodes and the relay electrodes to define a second metallic film.

10 Claims, 13 Drawing Sheets

SURFACE ACOUSTIC WAVE ELEMENT AND MANUFACTURING METHOD OF THE SAME

BACKGROUND OF THE INVENTION

1. Field of the Invention

The present invention relates to surface acoustic wave elements, and more specifically, it relates to a surface acoustic wave element to be bonded to a package with metallic bumps and a manufacturing method thereof.

2. Description of the Related Art

Along with increases in the frequency of mobile radio communications, a surface acoustic wave apparatus used for the mobile radio communications is also required to be usable in a high-frequency range. The surface acoustic wave apparatus includes a surface acoustic wave element having a piezoelectric substrate and a package for accommodating the surface acoustic wave element. Because an acoustic velocity of the surface acoustic wave element on the surface of the piezoelectric substrate is several thousands m/second, the wavelength of an interdigital electrode of the surface acoustic wave element is as small as several $\mu$m, when forming the surface acoustic wave element operating at approximately 800 MHz, for example. Therefore, there has been a problem that the absolute value of the electrode film thickness for optimizing characteristics of the surface acoustic wave element is reduced so that a loss due to an electrode resistance, i.e., an ohmic loss, increases.

In order to solve such a problem, a surface acoustic wave apparatus as shown in FIGS. 5A and 5B is disclosed in Japanese Unexamined Patent Application Publication No. 7-212175. In addition, FIG. 5B is a schematic sectional view along the lines of FIG. 5A connecting the dash-dot lines P—P, Q—Q, and R—R, and the dash-dot lines S and T of FIG. 5B indicate boundaries of the connection. In addition, in the drawings attached to this specification, in the same way as FIGS. 5A and 5B, the sections shown along the lines P—P, Q—Q, and R—R in the plan view are shown in the sectional view corresponding to the plan view by connecting them along the dash-dot lines S and T.

In a surface acoustic wave apparatus 201 in the prior art, on a piezoelectric substrate 202, an interdigital electrode 203 and reflector electrodes 204 and 205 disposed on both sides of the interdigital electrode 203 are arranged. Also, relay electrodes 206 and 207 are arranged to be electrically connected to the interdigital electrode 203. Furthermore, electrode pads 208 and 209 are arranged so as to be electrically connected to the relay electrodes 206 and 207, respectively. The electrode pads 208 and 209 correspond to parts to be electrically connected to electrodes of a package, and metallic bumps are arranged on the electrode pads 208 and 209. The surface acoustic wave apparatus 201 includes the interdigital electrode 203 and the reflector electrodes 204 and 205 among various electrodes mentioned above and conductive films 212 shown in FIG. 5B. As shown by the electrode pads 208 and 209 in FIG. 5B as representatives, on at least portions of the electrode pads 208 and 209 or the relay electrodes 206 and 207, second conductive films 213 are deposited. That is, in comparison with the interdigital electrode 203, portions of the relay electrodes 206 and 207 and the electrode pads 208 and 209 have an increased thickness, so that an ohmic loss due to an electrode resistance is reduced, thereby improving electrical characteristics.

By the way, because electronic components have recently been required to have a reduced size and height, a surface acoustic wave apparatus using a flip chip bonding technique is put into practical use. In the surface acoustic wave apparatus using the flip chip bonding technique, an electrode forming portion of the surface acoustic wave element opposes a mounting surface of a package, and electrodes of the surface acoustic wave element and electrodes of the package are bonded with metallic bumps. In this case, in order to increase the bonding strength between the metallic bump and the electrode pad, metallic films such as AU are disposed on the electrode pads of the surface acoustic wave element. On the metallic film made of AU, a metallic bump made of AU is disposed, which in turn is bonded to the package electrode surface. Alternatively, on the electrode pad, a metallic film made of Ag and having excellent solder wettability is disposed, so that a method in which solder bumps that are formed in the package in advance are bonded to the metallic films having excellent solder wettability is used.

When using the method described above, bonding wire is not required. Therefore, since the surface acoustic wave element is not required to have wire pads to be connected to the bonding wire, the planar area and height of the surface acoustic wave apparatus can be reduced.

Also, in the surface acoustic wave apparatus obtained by using the flip chip bonding technique, when a surface acoustic wave is actually vibrated, while the film thickness of electrodes other than electrodes to be propagated is increased, the ohmic loss is reduced, and losses and the reduction in Q of a resonator can be suppressed. In this case, first, the electrodes, in which a surface acoustic wave is vibrated and propagated, i.e., the interdigital electrode, reflector electrodes, bus bar electrodes, relay electrodes, and electrode pads are formed of the same conductive film. Next, in electrodes disposed in portions other than where a surface acoustic wave is vibrated and propagated, the second conductive film is deposited or the first conductive film is increased in thickness.

Therefore, when performing the bonding with the metallic bumps, after depositing the metallic films such as Au on the thick conductive films on the electrode pads, the metallic bumps such as Au may be formed thereon. Also, when performing the bonding with the solder bumps, on the plurality of deposited conductive films or on the electrode pads thickly formed by the increase in the conductive film thickness, the metallic films made of Ag and having excellent solder wettability are provided.

FIGS. 6A and 6B are a plan view and schematic sectional view for illustrating a conventional method using the flip chip bonding technique for manufacturing a surface acoustic wave apparatus operating at low frequencies, respectively.

According to the method, by patterning a conductive film 222, an IDT electrode 223, bus bar electrodes 224 and 225, reflector electrodes 226 and 227, relay electrodes 228 and 229, and electrode pads 230 and 231 are formed. Next, as shown in FIGS. 7A and 7B, on each of the electrode pads 230 and 231, a conductive film 232 and a metallic film 233 are deposited. The conductive film 232 is arranged for improving adhesion to the conductive film 222, and the metallic film 233 is arranged for improving the bonding strength between a metallic bump 234 shown in FIGS. 8A and 8B and the electrode pad.

Therefore, according to the method, after patterning the conductive film 222, the conductive film 232 and metallic film 233 have to be deposited.

On the other hand, when obtaining the surface acoustic wave apparatus operating at a high frequency range, as described above, in order to reduce the ohmic loss, on the conductive film 232, a conductive film 241 made of the same material as that of the conductive film 222 is deposited, and on the conductive film 241, the conductive film 232 and metallic film 233 have to be deposited, as shown in FIGS. 9A and 9B.

When manufacturing the surface acoustic wave apparatus operating at a low frequency range by bonding between the surface acoustic wave element and the package with the solder bumps disposed on the package instead of the metallic bumps made of Au, after the patterned conductive film 222 is formed on the piezoelectric substrate 221 as shown in FIGS. 6A and 6B, the metallic film 232 for improving the bonding strength to the conductive film 222 and a metallic film 242 to be a solder barrier are deposited on the electrode pads, and finally, a metallic film 243 having excellent solder wettability has to be deposited, as shown in FIGS. 10A and 10B. That is, a deposited structure made of three metallic layers has to be formed. Also, in this case, in order to reduce the ohmic loss of the surface acoustic wave apparatus operating at high frequencies, as shown in FIGS. 11A and 11B, on the metallic film 232, a conductive film 244 made of the same electrode material as that of the conductive film 222 is further deposited, and then, a multi-layered structure including a plurality of metallic films 242 and 243 has to be formed.

On the other hand, published application WO99/05788 discloses a surface acoustic wave apparatus, in which at least one of a bus bar and electrode pad includes a combination of a first conductive layer having Al as a principal ingredient, an intermediate layer, and a second conductive layer having Al as a principal ingredient. Therefore, when the electrode pad having the above-mentioned deposited structure with a large thickness, the mechanical strength is increased. In the WO99/05788 Publication, there is a description of a structure in that on the electrode pad, wire bonding or an Au bump is disposed.

As described above, when manufacturing a surface acoustic wave apparatus operating at a high frequency range, in any cases of the bonding between the surface acoustic wave element and the package with the metallic bumps on the surface acoustic wave element and of the bonding between the surface acoustic wave element and the package with the solder bumps disposed on the package, it has been necessary that one or more of the conductive films 241 and 244 are additionally deposited on a region other than where a surface acoustic wave is vibrated and propagated in comparison with the case of manufacturing the surface acoustic wave apparatus operating at a low frequency range. Therefore, there has been a problem that the manufacturing process is complicated and not cost effective.

In the structure disclosed in the WO99/05788 Publication, the electrode pad includes a combination of a first conductive layer having Al as a principal ingredient, an intermediate layer, and a second conductive layer having Al as a principal ingredient. However, in this structure, when forming the solder bump, since the top layer of the electrode pad is formed of the second conductive layer having Al as a principal ingredient, there has been a problem that the solder diffuses so that sufficient bonding strength cannot be obtained.

SUMMARY OF THE INVENTION

In order to overcome the problems describe above, preferred embodiments of the present invention provide a surface acoustic wave element and a manufacturing method thereof, the surface acoustic wave element being accommodated in a package by a flip chip bonding technique for use at a high frequency range, and is capable of simplifying the manufacturing process and reliably obtaining excellent electrical characteristics due to the reduction in an ohmic loss, and which is excellent in the bump bonding strength when using solder bumps.

In accordance with a first preferred embodiment of the present invention, a surface acoustic wave element is accommodated within a package and is to be bonded to the package with solder bumps provided on the package, the surface acoustic wave element includes a piezoelectric substrate, at least one interdigital electrode provided on the piezoelectric substrate, a pair of bus bar electrodes connected to the interdigital electrode, relay electrodes connected to the bus bar electrodes, electrode pads connected to the relay electrodes, and electrically connected to the package, first metallic films provided on the electrode pads for improving bonding strength to the solder bumps, and second metallic films made of the same material as that of the first metallic film, and provided on at least one of the bus bar electrodes and the relay electrodes.

Preferably, the first and second metallic films have a multi-layered structure formed by depositing a plurality of metallic layers. In this case, the top metallic layer of the first and second metallic films is made of a metallic material having excellent bonding properties to solder bumps while the other metallic layers are made of a metallic material with low electric resistance, for example, so that both the improvement in the bonding strength to bumps and improvement in the reduction of the ohmic loss are achieved.

Preferably, the first and second metallic films have a multi-layered structure formed by depositing a plurality of metallic layers, and the top metallic layer is preferably made of one of Ag and Au. In this case, since the top metallic layer in the first and second metallic films has excellent solderability, the first metallic film can be rigidly and readily bonded to an electrode land of the package with solder bumps therebetween.

Preferably, the interdigital electrode has a multi-layered structure formed by depositing a plurality of metallic layers, and wherein at least one metallic layer in the first and second metallic films is preferably made of a metal having a smaller specific electric resistance in comparison with the bottom metallic layer of the metallic layers constituting the interdigital electrode. Thereby, the specific electric resistance of at least one metallic layer in the first and second metallic films is relatively small, so that the ohmic loss is even further reduced in the metallic film while the thickness of the metallic layer made of a metal with relatively small specific electrical resistance is greatly reduced.

In accordance with a second preferred embodiment of the present invention, a manufacturing method of a surface acoustic wave element configured according to other preferred embodiments of the present invention includes the steps of forming the interdigital electrode, the bus bar electrodes, the relay electrodes, and the electrode pads on the piezoelectric substrate, forming the first metallic films on the electrode pads, and forming the second metallic films on at least one of the bus bar electrodes and the relay electrodes.

In accordance with a third preferred embodiment of the present invention, a communication apparatus includes a surface acoustic wave element configured according other preferred embodiments of the present invention as a band-pass filter.

In the surface acoustic wave element and the manufacturing method thereof according to preferred embodiments of the present invention, the second metallic film, preferably made of the same material as that of the first metallic film disposed on the electrode pad for increasing the bonding strength to the solder bump in the package side, is disposed on at least one of the bus bar electrode and relay electrode. That is, in the process for forming the first metallic film on the electrode pad for increasing the bonding strength to the solder bump in the package, also on at least one of the bus bar electrode and relay electrode, the second metallic film made of the same material is formed. Therefore, without complicating the manufacturing process, the electrical resistance loss of the electrode is greatly reduced. Thereby, an additional process is not required for increasing the film thickness of the bus bar electrode and relay electrode, so that the cost reduction for manufacturing the surface acoustic wave apparatus using the flip chip bonding technique can be achieved.

Additionally, since the increasing of the film-thickness of the bus bar electrode and relay electrode is performed by the metallic material having bonding strength to the conductive film constituting the IDT electrode, at least the same characteristics as those in the case of the film-thickness increasing with the same electrode material as those of the IDT electrode and relay electrode can be obtained.

Other features, elements, characteristics, steps and advantages of the present invention will become more apparent from the following detailed description of preferred embodiments thereof with reference to the attached drawings.

DETAILED DESCRIPTION OF PREFERRED EMBODIMENTS

The present invention will be described by illustrating specific preferred embodiments according to the present invention below.

Figure 1A:
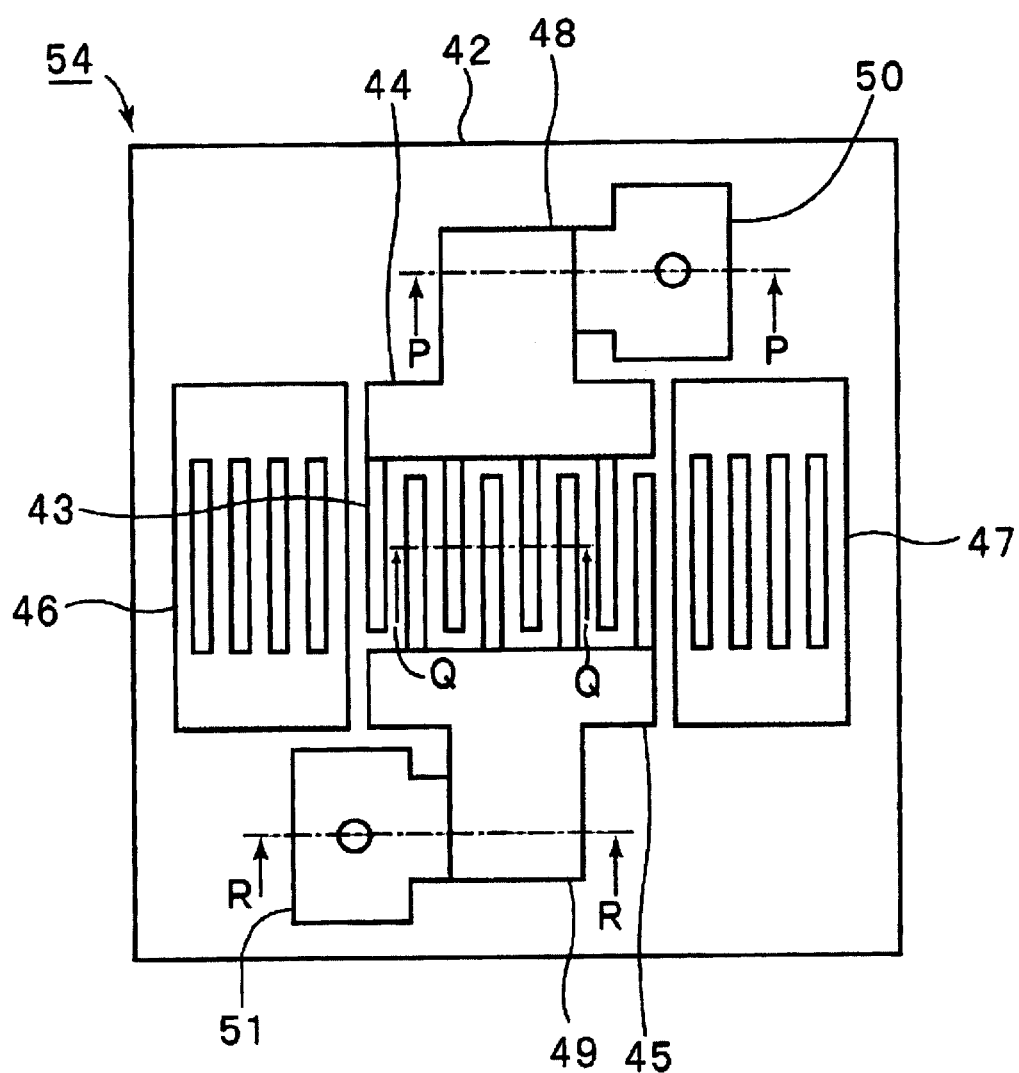
FIGS. 1A and 1B are a schematic plan view and schematic sectional view along the lines P—P, Q—Q, and R—R of FIG. 1A connected with the dash-dot lines S and T therebetween for illustrating a surface acoustic wave element according to a preferred embodiment of the present invention.
Figure 1B:
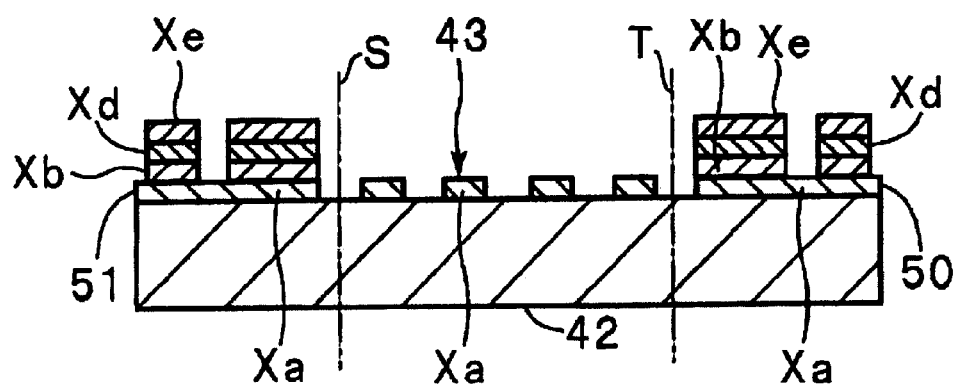

FIGS. 1A and 1B are a plan view and schematic sectional view, respectively, for illustrating a surface acoustic wave element according to a preferred embodiment of the present invention. FIGS. 2A to 2D are schematic sectional views for illustrating a manufacturing method of the surface acoustic wave element according to the present preferred embodiment.

According to the present preferred embodiment, a surface acoustic wave element is bonded to a package with solder bumps arranged in the package by using a flip chip bonding technique.

According to the present preferred embodiment, a surface acoustic wave element 54 shown in FIGS. 1A and 1B is prepared. In the surface acoustic wave element 54, on a substantially rectangular plate-type piezoelectric substrate 42, an IDT electrode 43, a pair of bus bar electrodes 44 and 45, reflector electrodes 46 and 47, relay electrodes 48 and 49, and electrode pads 50 and 51 are formed with conductive films Xa.

As the piezoelectric substrate 42, a piezoelectric single crystal such as $LiTaO_3$, $LiNbO_3$, or crystal, and piezoelectric ceramics such as lead zirconate titanate ceramics, or other suitable material may be used.

The conductive film Xa is made of an appropriate conductive material such as Al. The method for forming the conductive film Xa on the piezoelectric substrate 42 is not specifically limited. An appropriate method such as vapor deposition, sputtering, or plating may be used.

On the bus bar electrodes 44 and 45, relay electrodes 48 and 49, and electrode pads 50 and 51, metallic films Xb, metallic films Xd to be solder barrier layers, and metallic films Xe with excellent bonding properties to solder bumps are deposited except on a portion of the vicinities of the electrode pads. The metallic film Xb is preferably made of NiCr or Ti, for example, for improving the bonding strength to the metallic film Xd to be the solder barrier layer and the conductive film Xa. The metallic films Xe is preferably made of a metal having excellent bonding properties to solder bumps such as Ag. The metallic film Xd to be the solder barrier layer is preferably made of an appropriate metal, such as Ni, that is difficult to produce a solder leach.

In addition, the IDT electrode 43 is formed according to the present preferred embodiment. Alternatively, a plurality of IDT electrodes may be formed, and the reflector may not be necessarily provided.

When obtaining the surface acoustic wave element according to the present preferred embodiment, on the entire surface of the piezoelectric substrate 42, the conductive film Xa is formed. Then, the patterned conductive films Xa are formed on the piezoelectric substrate 42 by patterning, or other suitable process.

Figure 2A:
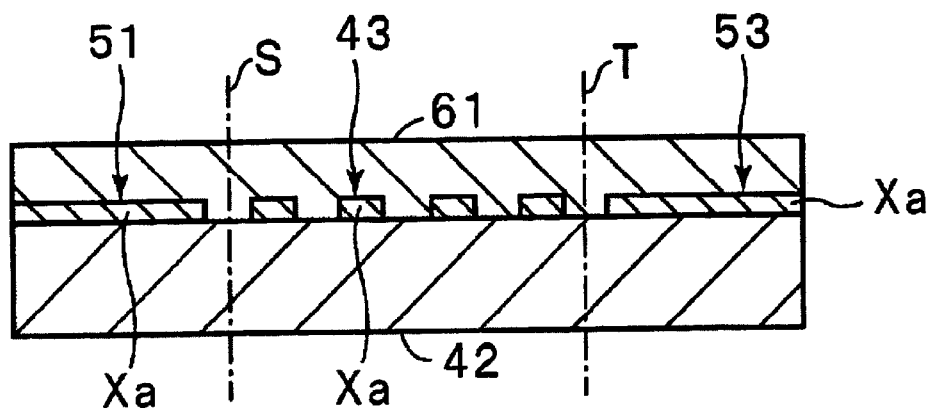
FIGS. 2A to 2D are schematic sectional views for illustrating an electrode structure of the surface acoustic wave element according to a preferred embodiment of the present invention.

That is, as shown in FIG. 2A, on the piezoelectric substrate 42, the patterned conductive films Xa are disposed. Thereby, the IDT electrode 43, bus bar electrodes 44 and 45, reflector electrodes 46 and 47, relay electrodes 48 and 49, and electrode pads 50 and 51 are formed with the conductive films Xa.

Thereafter, as shown in FIG. 2A, a resist 61 is deposited on the entire surface.

Then, by the development using exposure and a photomask, the resist portion that is not required is removed, so that the resist 61 is patterned.

Figure 2B:
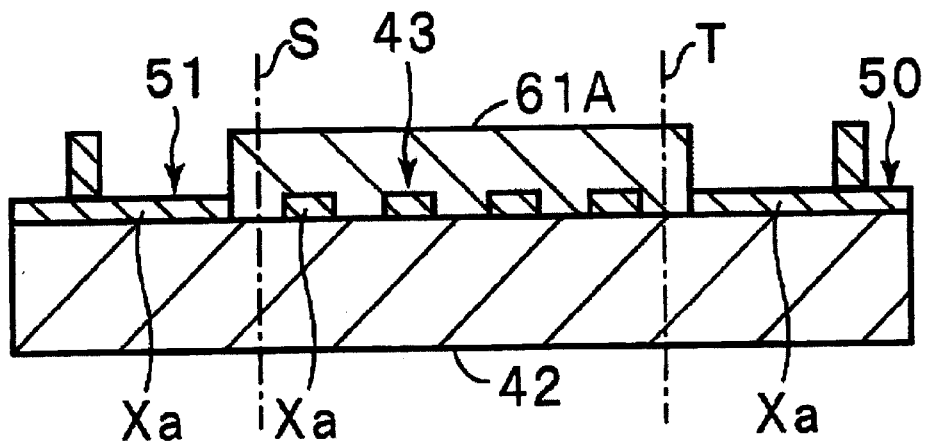

In such a manner, as shown in FIG. 2B, the patterned resist 61A is formed. In this state, the IDT electrode 43, reflector electrodes 46 and 47, and portions of the electrode pads 50 and 51 are covered with the resist 61A.

Figure 2C:
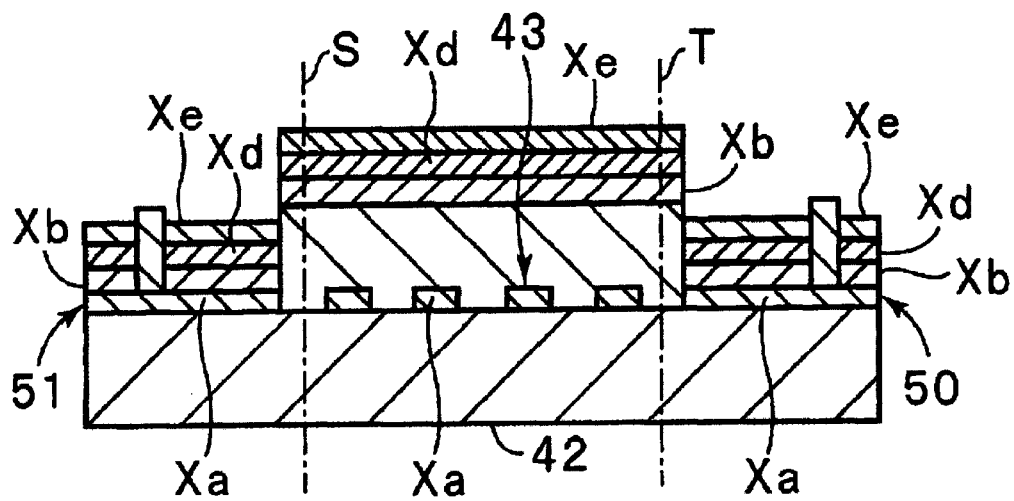

Thereafter, as shown in FIG. 2C, the metallic films Xb preferably made of NiCr or Ti are formed. Then, on the entire surfaces of the metallic films Xb, the metallic films Xd made of Ni for functioning as a solder barrier and the metallic films Xe preferably made of Ag and having excellent solder wettability are sequentially formed. The forming of these metallic films Xb, Xd, and Xe may be performed by an appropriate method such as vapor deposition and sputtering.

Figure 2D:
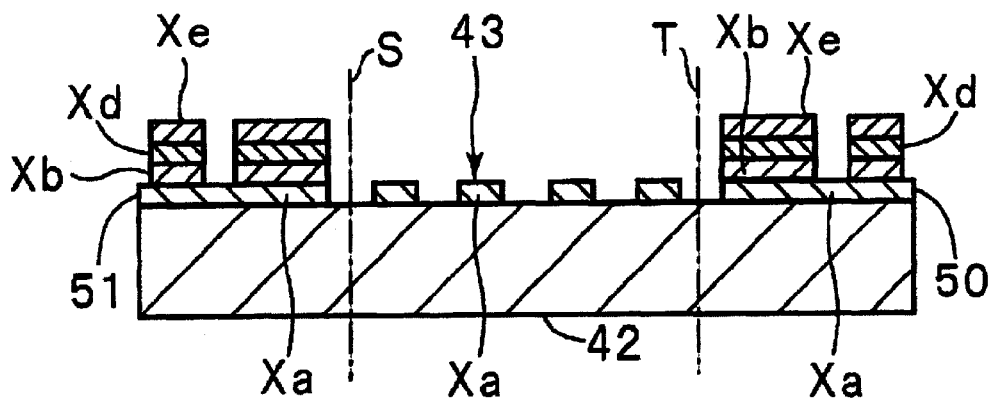
Figure 6A:
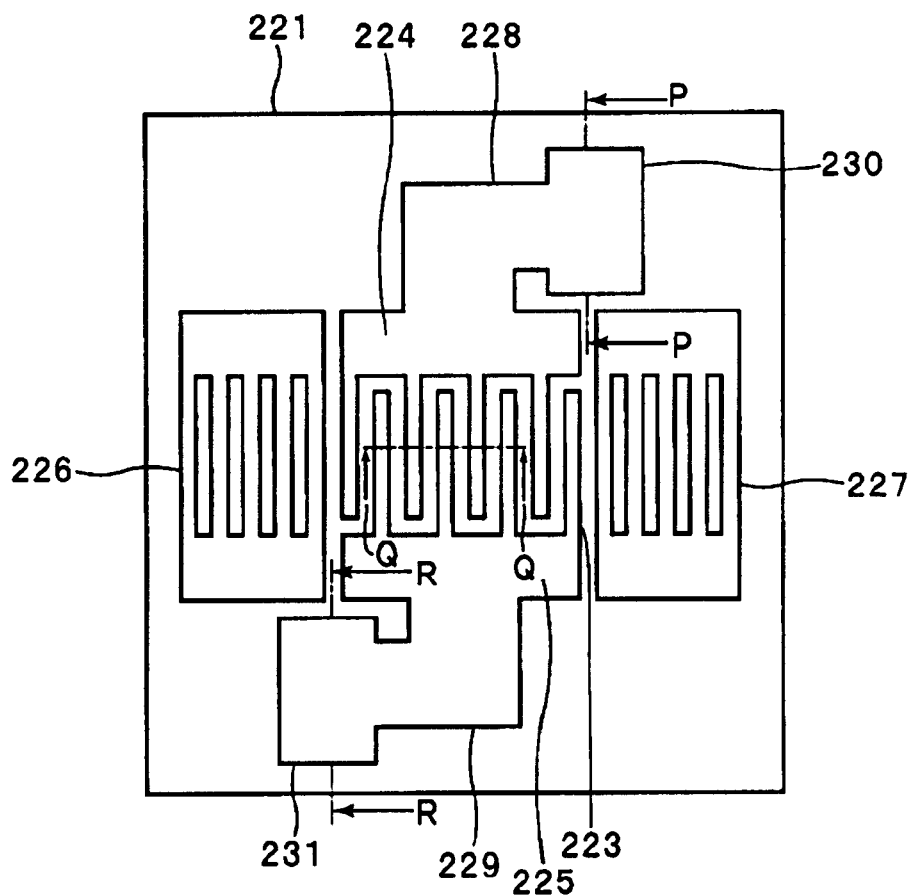
FIGS. 6A and 6B are a schematic plan view and sectional view along the lines P—P, Q—Q, and R—R of FIG. 6A connected with the dash-dot lines S and T therebetween for illustrating a manufacturing process of the conventional surface acoustic wave apparatus shown in FIGS. 5A and 5B.
Figure 6B:
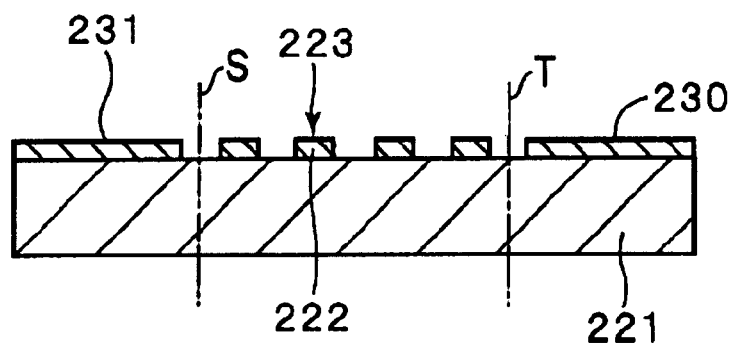
Figure 7A:
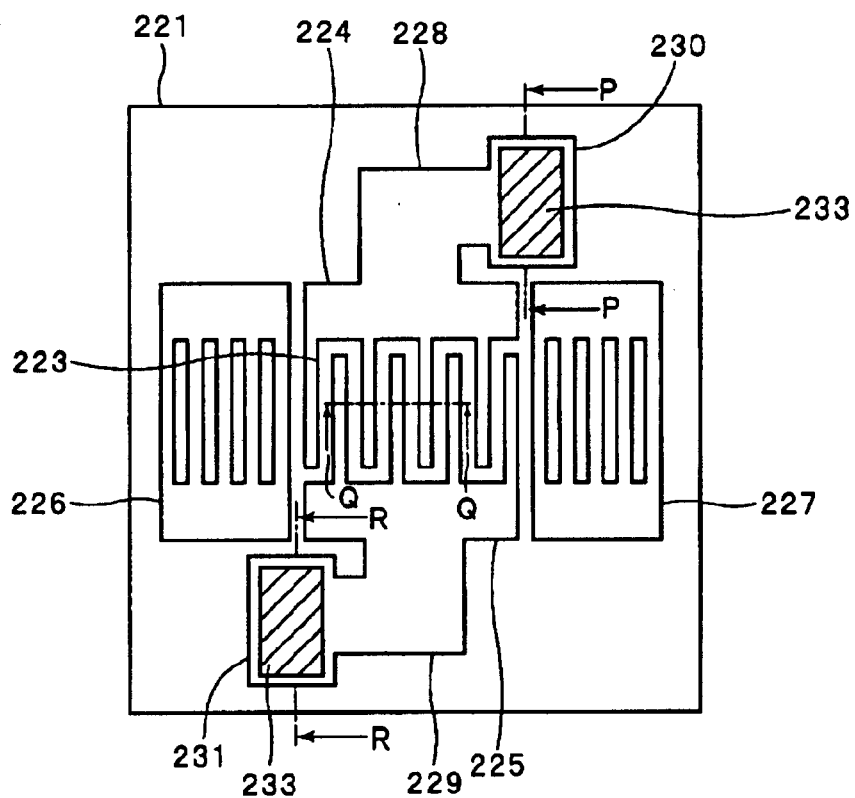
FIGS. 7A and 7B are a schematic plan view and sectional view at the lines P—P, Q—Q, and R—R of FIG. 7A connected with the dash-dot lines S and T therebetween for illustrating an example of a conventional surface acoustic wave apparatus used at a high-frequency range.
Figure 7B:
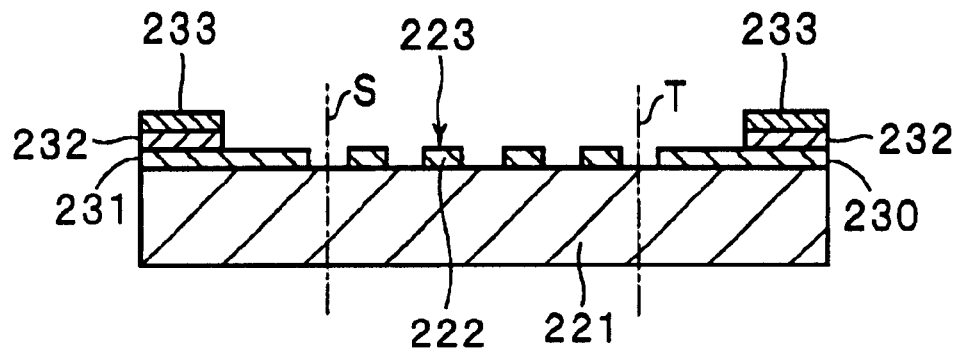
Figure 8A:
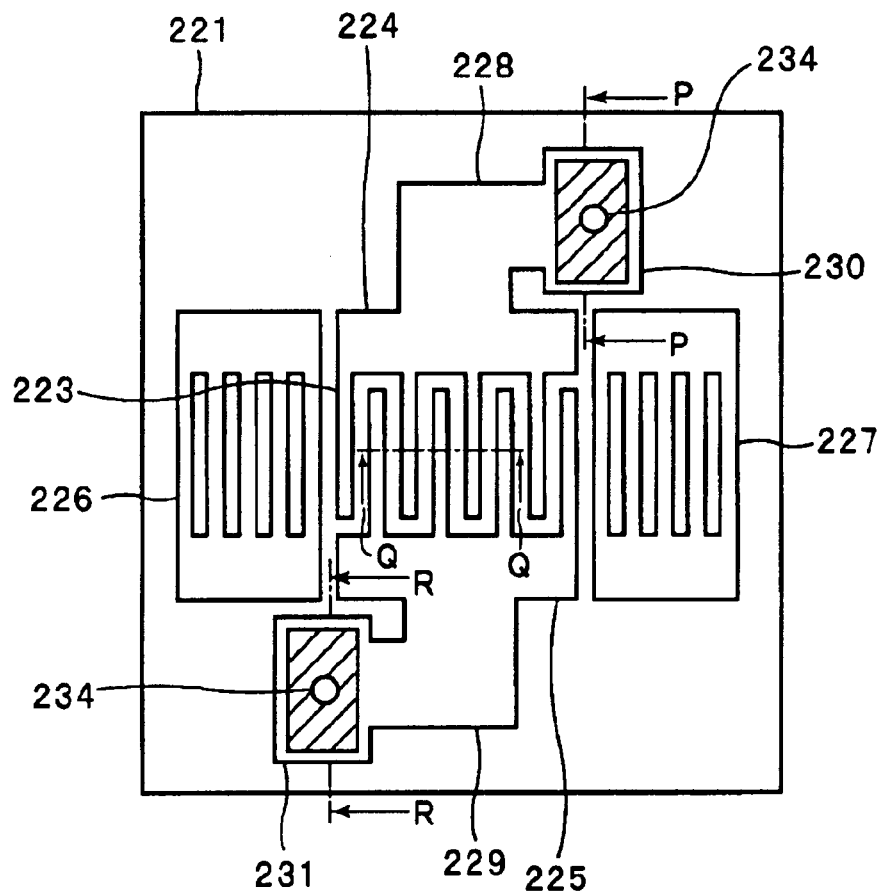
FIGS. 8A and 8B are a schematic plan view and sectional view along the lines P—P, Q—Q, and R—R of FIG. 8A connected with the dash-dot lines S and T therebetween for illustrating another example of a conventional surface acoustic wave apparatus.
Figure 8B:
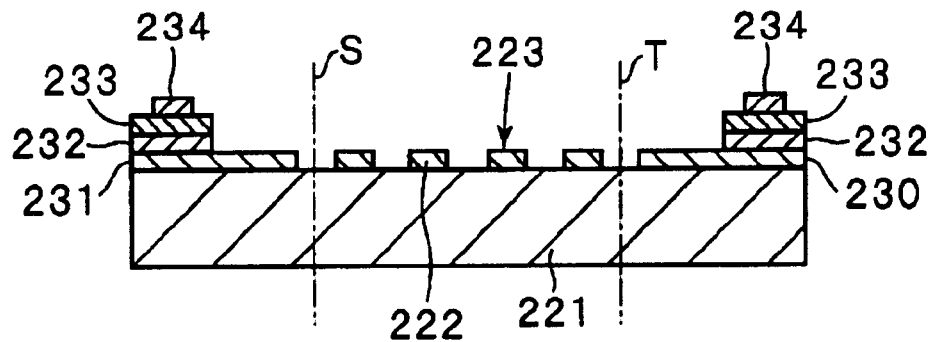
Figure 9A:
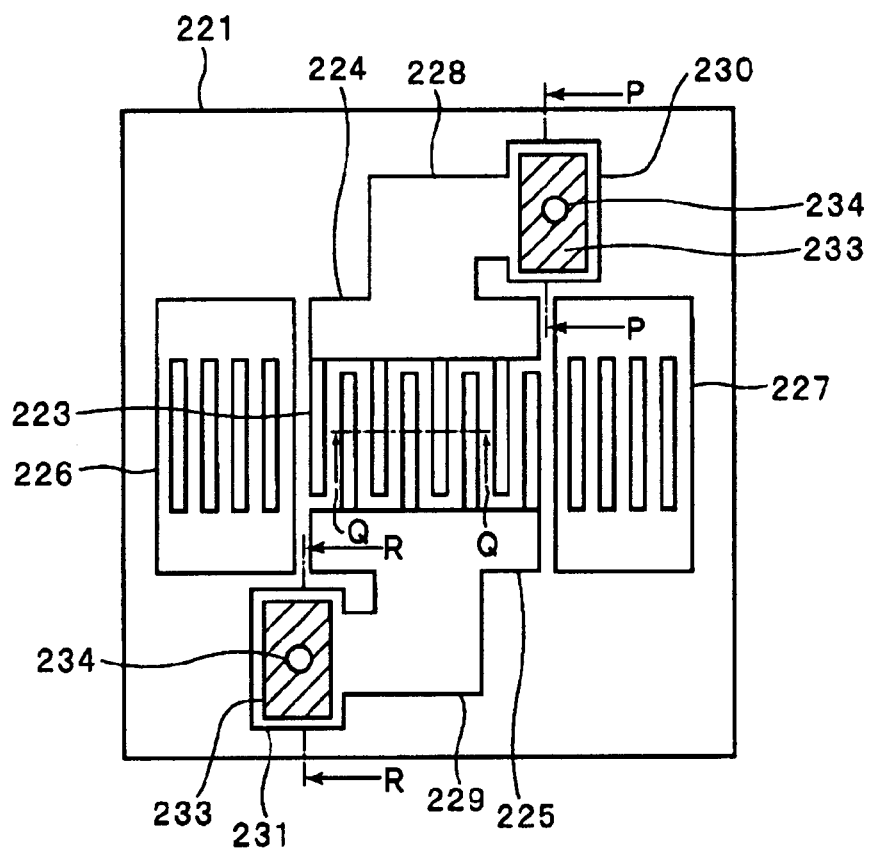
FIGS. 9A and 9B are a schematic plan view and sectional view at the lines P—P, Q—Q, and R—R of FIG. 9A connected along the dash-dot lines S and T therebetween for illustrating still another example of a conventional surface acoustic wave apparatus used at a high-frequency range.
Figure 9B:
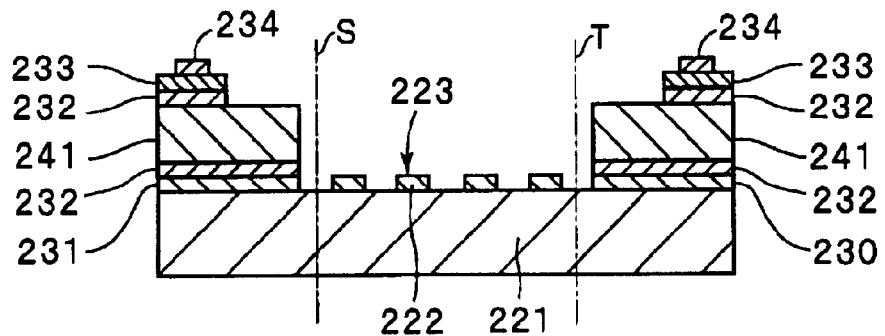
Figure 10A:
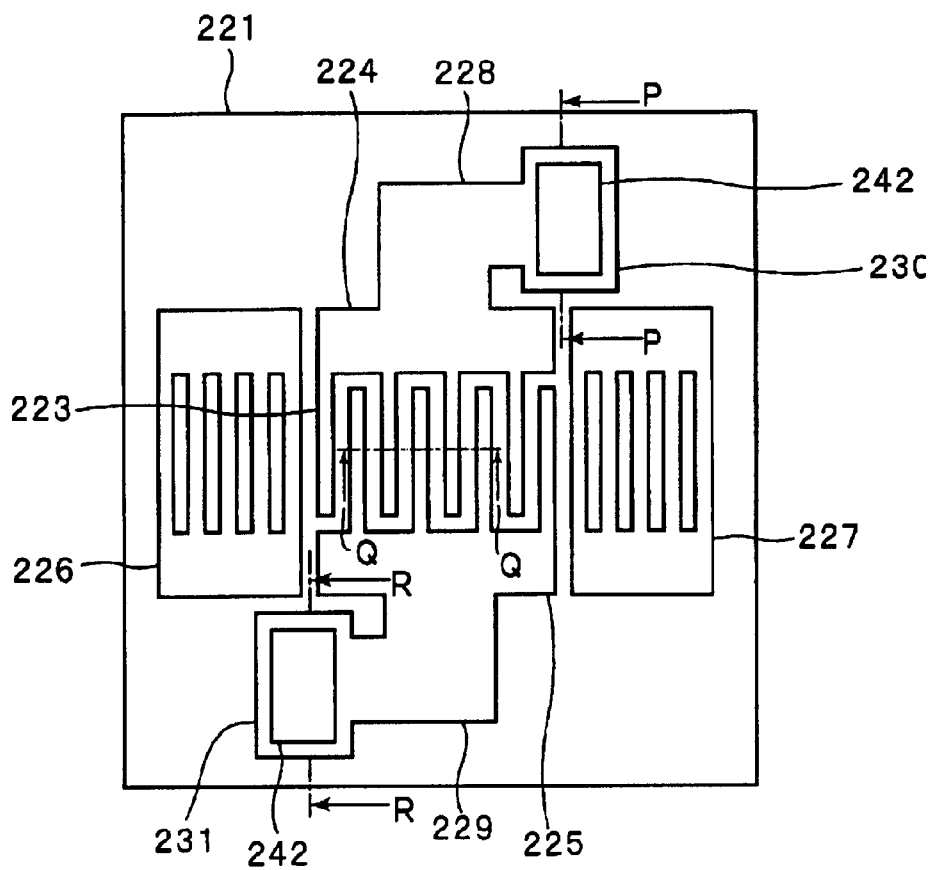
FIGS. 10A and 10B are a schematic plan view and sectional view along the lines P—P, Q—Q, and R—R of FIG. 10A connected with the dash-dot lines S and T therebetween for illustrating still another example of a conventional surface acoustic wave apparatus.
Figure 10B:
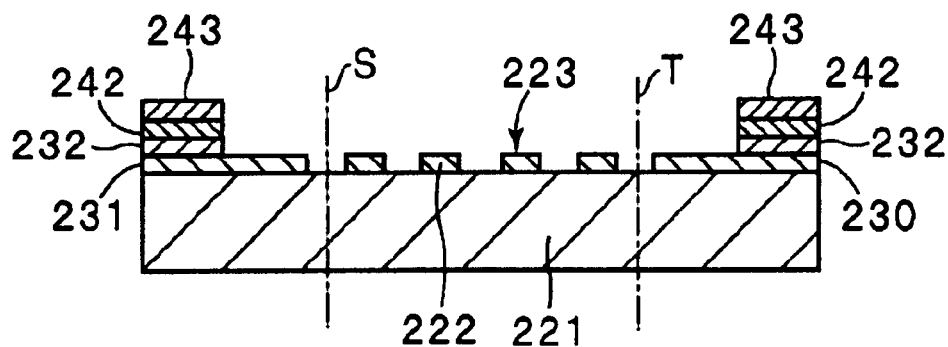
Figure 11A:
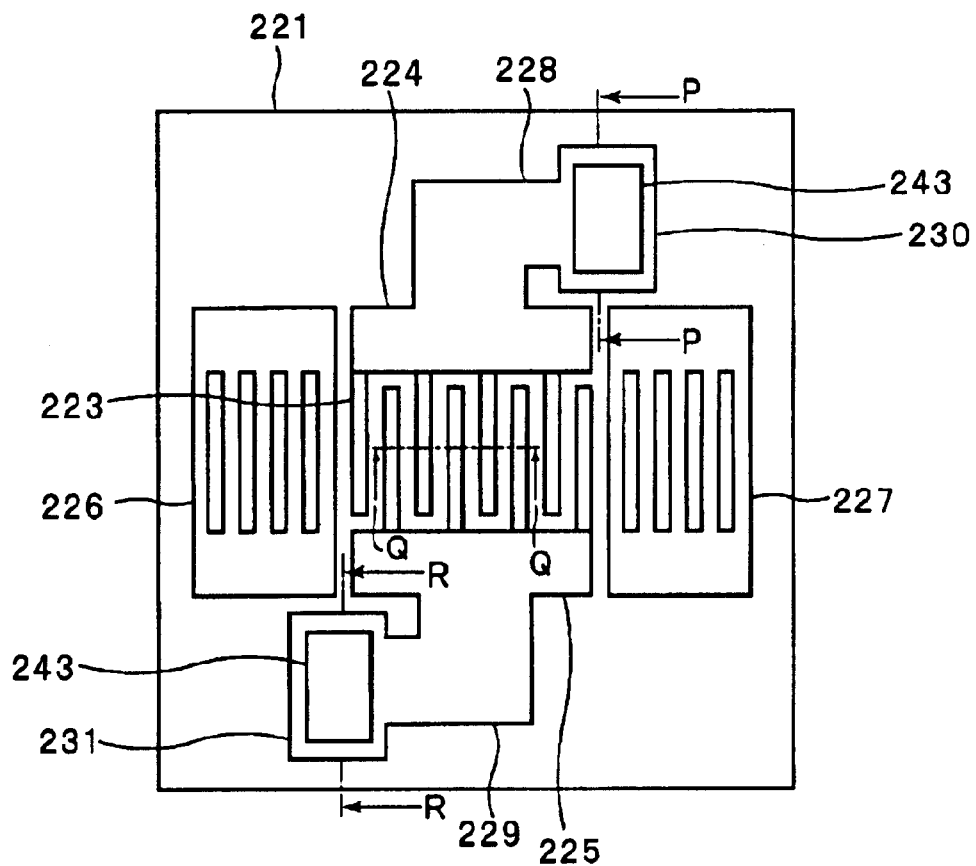
FIGS. 11A and 11B are a schematic plan view and sectional view along the lines P—P, Q—Q, and R—R of FIG. 11A connected with the dash-dot lines S and T therebetween for illustrating still another example of a conventional surface acoustic wave apparatus.
Figure 11B:
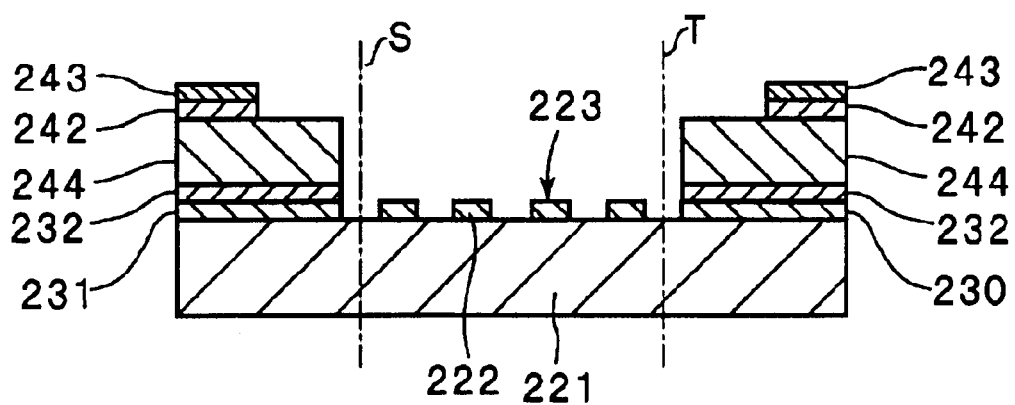

Thereafter, the metallic films Xb, Xd, and Xe on the resist 61A are lifted off together with the resist 61A. In such a manner, as shown in FIG. 2D, on the bus bar electrodes 44 and 45, relay electrodes 48 and 49, and electrode pads 50 and 51, the deposited metallic films constituting the metallic films Xb, Xd, and Xe are deposited so as to obtain the surface acoustic wave element 54 shown in FIGS. 6A and 6B.

Figure 4:
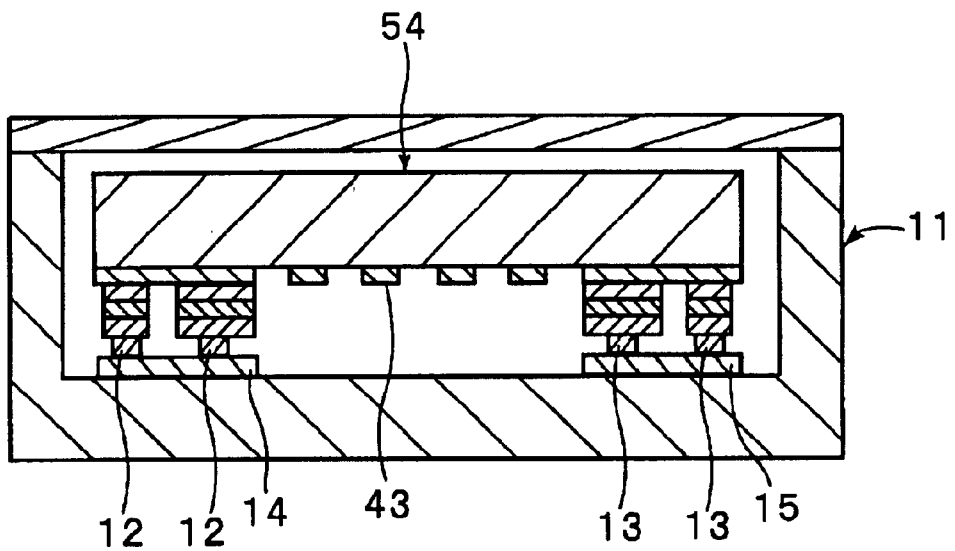
FIG. 4 is a schematic sectional view for illustrating a surface acoustic wave apparatus according to a preferred embodiment of the present invention.
Figure 5A:
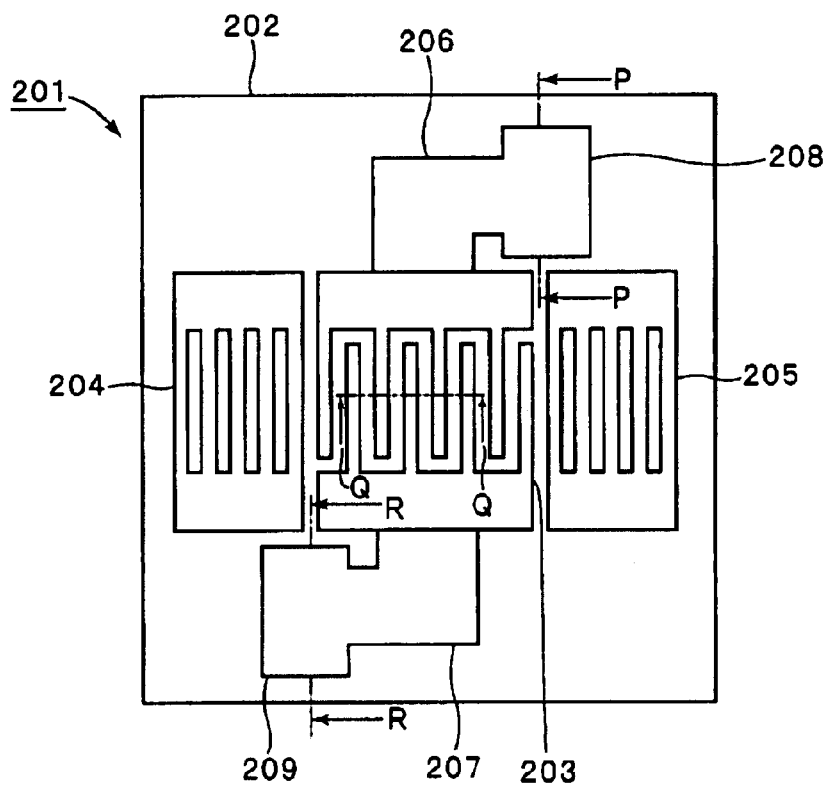
FIGS. 5A and 5B are a schematic plan view and schematic sectional view along the lines P—P, Q—Q, and R—R of FIG. 5A connected with the dash-dot lines S and T therebetween for illustrating an example of a conventional surface acoustic wave apparatus.
Figure 5B:
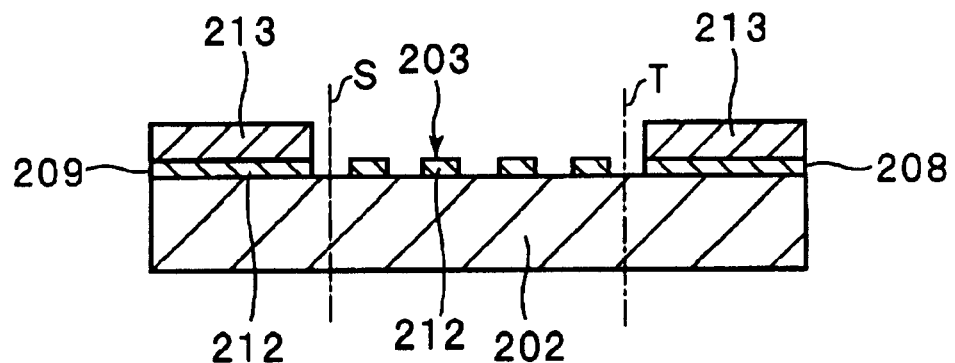

When bonding the surface acoustic wave element 54 to a package, as shown in FIG. 4, the surface acoustic wave element 54 is placed on electrodes 14 and 15 on a package 11 from the side of the electrode forming surface so that the electrode pads 50 and 51 are brought into contact with solder bumps 12 and 13 disposed on the electrodes 14 and 15 on the package 11, respectively. Then, by heating, the surface acoustic wave element 54 is bonded to the electrodes 14 and 15 on the package 11 with the respective solder bumps 12 and 13 therebetween so as to obtain the surface acoustic wave apparatus according to the present preferred embodiment.

According to the present preferred embodiment, on each of the bus bar electrode, relay electrode, and electrode pad, the metallic films Xb, Xd, and Xe are deposited. The metallic films Xb, Xd, and Xe on the electrode pad constitute the first metallic film according to preferred embodiments of the present invention, whereas the metallic films Xb, Xd, and Xe on each of the bus bar electrode and relay electrode constitute the second metallic film. Therefore, just like the structure that the conductive film made of the same electrode material as that of the conductive film Xa is deposited on the conductive film Xa, the electrical resistance of the electrode elements is greatly reduced, resulting in the reduction in the ohmic loss. Therefore, without using the process for depositing the conductive film made of the same electrode material as that of the conductive film Xa for reducing the ohmic loss, that is, without using the complicated electrode forming process, the loss of the surface acoustic wave apparatus and the reduction in Q are minimized.

In addition, according to the present preferred embodiment, the film thickness of the metallic film Xe for bonding to the solder bumps is not necessarily larger than that of the conductive film Xa defining the IDT electrode 43. That is, when the specific electrical resistances of the metallic films Xb to Xe are smaller than that of the conductive film Xa, it is not necessary that the thickness of the metallic films Xb, Xd, and Xe be larger than that of the conductive film Xa.

Figure 3:
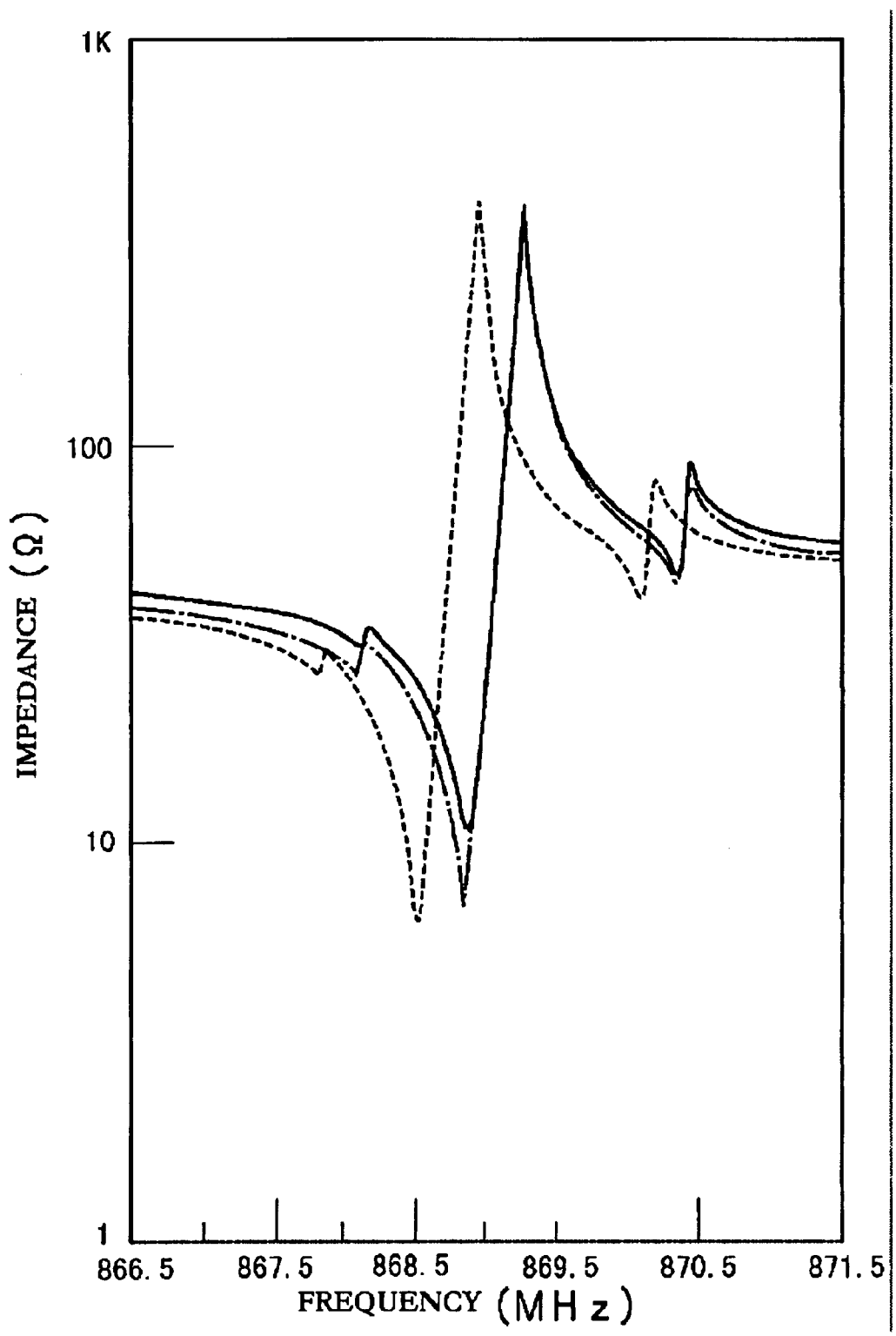
FIG. 3 is a drawing showing impedance/frequency characteristics of the surface acoustic wave element according to a preferred embodiment, a surface acoustic wave apparatus, and a surface acoustic wave element formed according to a conventional method, which are prepared for comparison purposes.

FIG. 3 shows impedance/frequency characteristics of the surface acoustic wave apparatus according to the present preferred embodiment with the dotted lines. For comparison purposes, characteristics of a comparative example, in which the film thickness of the bus bar electrode and relay electrode is not increased, are shown with the solid lines while electrical characteristics of a conventional example, in which a conductive film element made of the same electrode material as that of the IDT electrode is increased according to a conventional method, are shown with the dash-dot lines. As is apparent from FIG. 3, it is understood that according to the present preferred embodiment, resonance characteristics with large Q are obtained in comparison with the comparative example, in which the film thickness of the bus bar electrode is not increased, while at least the same resonance characteristics as the conventional example are obtained.

In addition, according to preferred embodiments of the present invention, the second metallic films are disposed on the bus bar electrode and relay electrode, the second metallic film is provided for reducing the ohmic loss, and it may be disposed on one of the bus bar electrode and relay electrode or it may be partially disposed in portions of the bus bar electrode and relay electrode. However, it is preferable that as described in the present preferred embodiment, the second metallic films be formed on both the bus bar electrode and relay electrode.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave element accommodated within a package and to be bonded to the package via solder bumps provided on the package, the surface acoustic wave element comprising:

a piezoelectric substrate;

at least one interdigital electrode provided on the piezoelectric substrate;

a pair of bus bar electrodes connected to the interdigital electrode;

relay electrodes connected to the bus bar electrodes;

electrode pads connected to the relay electrodes, and electrically connected to the package;

first metallic films provided on the electrode pads for improving bonding strength to the solder bumps; and second metallic films made of the same material as that of the first metallic film, and provided on at least one of the bus bar electrodes and the relay electrodes.

2. A surface acoustic wave element according to claim 1, wherein the first and second metallic films have a multi-layered structure including a plurality of metallic layers.

3. A surface acoustic wave element according to claim 1, wherein the first and second metallic films have a multi-layered structure including a plurality of metallic layers, and the top metallic layer is made of one of Ag and Au.

4. A surface acoustic wave element according to claim 2, wherein the interdigital electrode has a multi-layered structure including a plurality of metallic layers, wherein at least one metallic layer in the first and second metallic films is made of a metal having a smaller specific electric resistance in comparison with the bottom metallic layer of the metallic layers constituting the interdigital electrode.

5. A surface acoustic wave element according to claim 1, wherein the surface acoustic wave element is flip-chip bonded to the package via the solder bumps.

6. A surface acoustic wave element according to claim 1, wherein the piezoelectric substrate is made of one of a piezoelectric single crystal and piezoelectric ceramics.

7. A surface acoustic wave element according to claim 1, wherein the first metallic films are made of one of NiCr and Ti.

8. A surface acoustic wave element according to claim 1, wherein the second metallic films are made of one of NiCr and Ti.

9. A surface acoustic wave element according to claim 1, wherein the second metallic films are provided on both of the bus bar electrodes and the relay electrodes.

10. A communication apparatus including a surface acoustic wave element according to claim 1 as a band-pass filter.

* * * * *